United States Patent
Raje et al.

(10) Patent No.: US 8,378,261 B2
(45) Date of Patent: Feb. 19, 2013

(54) AUTOMATED ASSEMBLY METHOD FOR A MOTOR VEHICLE

(75) Inventors: Sachin K. Raje, Dublin, OH (US); Ravi K. Sinha, Pune (IN); Gary Elliott, Waterford, MI (US)

(73) Assignee: Honda Motor Co., Ltd., Tokyo (JP)

( * ) Notice: Subject to any disclaimer, the term of this patent is extended or adjusted under 35 U.S.C. 154(b) by 791 days.

(21) Appl. No.: 12/557,907

(22) Filed: Sep. 11, 2009

(65) Prior Publication Data

US 2011/0062132 A1    Mar. 17, 2011

(51) Int. Cl.
*B23K 9/00* (2006.01)

(52) U.S. Cl. ........................ 219/137 R; 700/96
(58) Field of Classification Search .............. 219/137 R; 700/96
See application file for complete search history.

(56) References Cited

U.S. PATENT DOCUMENTS

| | | | |
|---|---|---|---|
| 4,998,005 A | 3/1991 | Rathi et al. | |
| 5,380,978 A * | 1/1995 | Pryor | 219/121.64 |
| 5,910,894 A | 6/1999 | Pryor | |
| 5,917,726 A | 6/1999 | Pryor | |
| 6,219,049 B1 | 4/2001 | Zuffante et al. | |
| 6,415,191 B1 | 7/2002 | Pryor | |
| 6,510,357 B1 * | 1/2003 | Naik et al. | 700/98 |
| 6,611,725 B1 | 8/2003 | Harrison et al. | |
| 6,792,397 B2 | 9/2004 | Yoshikawa et al. | |
| 7,079,990 B2 | 7/2006 | Haller et al. | |
| 7,206,661 B2 | 4/2007 | Subrahmanyam et al. | |
| 7,295,205 B2 | 11/2007 | Wollny et al. | |
| 2003/0071810 A1 | 4/2003 | Shoov et al. | |
| 2005/0022152 A1 * | 1/2005 | Turk et al. | 717/100 |
| 2008/0111813 A1 | 5/2008 | Gatzke et al. | |
| 2008/0165188 A1 | 7/2008 | Uraki | |

* cited by examiner

*Primary Examiner* — David Vu
*Assistant Examiner* — Brandon Fox
(74) *Attorney, Agent, or Firm* — Plumsea Law Group, LLC

(57) ABSTRACT

A method of automated assembly for a motor vehicle is disclosed. The method includes a step of automatically determining weld characteristics according to weld location information. The method further includes a step of generating an automated weld program according to the weld characteristics and a step of controlling a welding robot according to the automated weld program.

29 Claims, 11 Drawing Sheets

AUTOMATED ASSEMBLY METHOD FOR A MOTOR VEHICLE

BACKGROUND OF THE INVENTION

1. Field of the Invention

The present invention relates to a motor vehicle and in particular to an automated assembly method for a motor vehicle.

2. Description of Related Art

Methods of using fastener information in computer design systems have been previously proposed. However, the related art lacks provisions for enhancing the overall assembly method for a motor vehicle, including efficiently creating and using weld information during design and assembly processes.

SUMMARY OF THE INVENTION

The invention discloses an automated assembly method for a motor vehicle. The invention can be used in connection with a motor vehicle. The term "motor vehicle" as used throughout the specification and claims refers to any moving vehicle that is capable of carrying one or more human occupants and is powered by any form of energy. The term motor vehicle includes, but is not limited to: cars, trucks, vans, minivans, SUVs, motorcycles, scooters, boats, personal watercraft, and aircraft.

In some cases, the motor vehicle includes one or more engines. The term "engine" as used throughout the specification and claims refers to any device or machine that is capable of converting energy. In some cases, potential energy is converted into kinetic energy. For example, energy conversion can include a situation where the chemical potential energy of a fuel or fuel cell is converted into rotational kinetic energy or where electrical potential energy is converted into rotational kinetic energy. Engines can also include provisions for converting kinetic energy into potential energy. For example, some engines include regenerative braking systems where kinetic energy from a drivetrain is converted into potential energy. Engines can also include devices that convert solar or nuclear energy into another form of energy. Some examples of engines include, but are not limited to: internal combustion engines, electric motors, solar energy converters, turbines, nuclear power plants, and hybrid systems that combine two or more different types of energy conversion processes.

In one aspect, the invention provides a method of making a motor vehicle, comprising the steps of: receiving a vehicle assembly within a network of computers; receiving weld location information associated with the vehicle assembly; generating a set of weld characteristics based on the weld location information using at least one computer of the network of computers; determining an automated weld program according to the weld location information and set of weld characteristics using at least one computer of the network of computers; and controlling a welding robot according to the automated weld program.

In another aspect, the invention provides a method of making a motor vehicle, comprising the steps of: receiving a vehicle assembly including a plurality of assembly parts; receiving a weld location for a first assembly part of the plurality of assembly parts; determining a second assembly part to be connected to the first assembly part according to the weld location information; calculating an automated weld program, the automated weld program including information related to welding the first assembly part to the second assembly part; and controlling a welding robot according to the automated weld program.

In another aspect, the invention provides a method of making a motor vehicle, comprising the steps of: receiving a vehicle assembly including a plurality of assembly parts; receiving a weld location for a first assembly part of the plurality of assembly parts; retrieving a predefined sphere size; determining a spherical surface about the weld location, the spherical surface being associated with the predefined sphere size; retrieving a predetermined distance; determining a set of connected assembly parts, the set of connected assembly parts including all the assembly parts within the predetermined distance from the spherical surface; calculating an automated weld program according to the weld location information and set of connected assembly parts; and controlling a welding robot according to the automated weld program.

In another embodiment, the invention provides a method of making a motor vehicle, comprising the steps of: receiving a vehicle assembly including a plurality of assembly parts; receiving a weld location for a first assembly part of the plurality of assembly parts; creating a cylinder about the weld location; determining a set of connected parts, the set of connected parts including all the assembly parts that intersect the cylinder; calculating an automated weld program according to the weld location information and set of connected assembly parts; and controlling a welding robot according to the automated weld program.

Other systems, methods, features and advantages of the invention will be, or will become, apparent to one of ordinary skill in the art upon examination of the following figures and detailed description. It is intended that all such additional systems, methods, features and advantages included within this description and this summary, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION OF THE EXEMPLARY EMBODIMENTS

Figure 1:
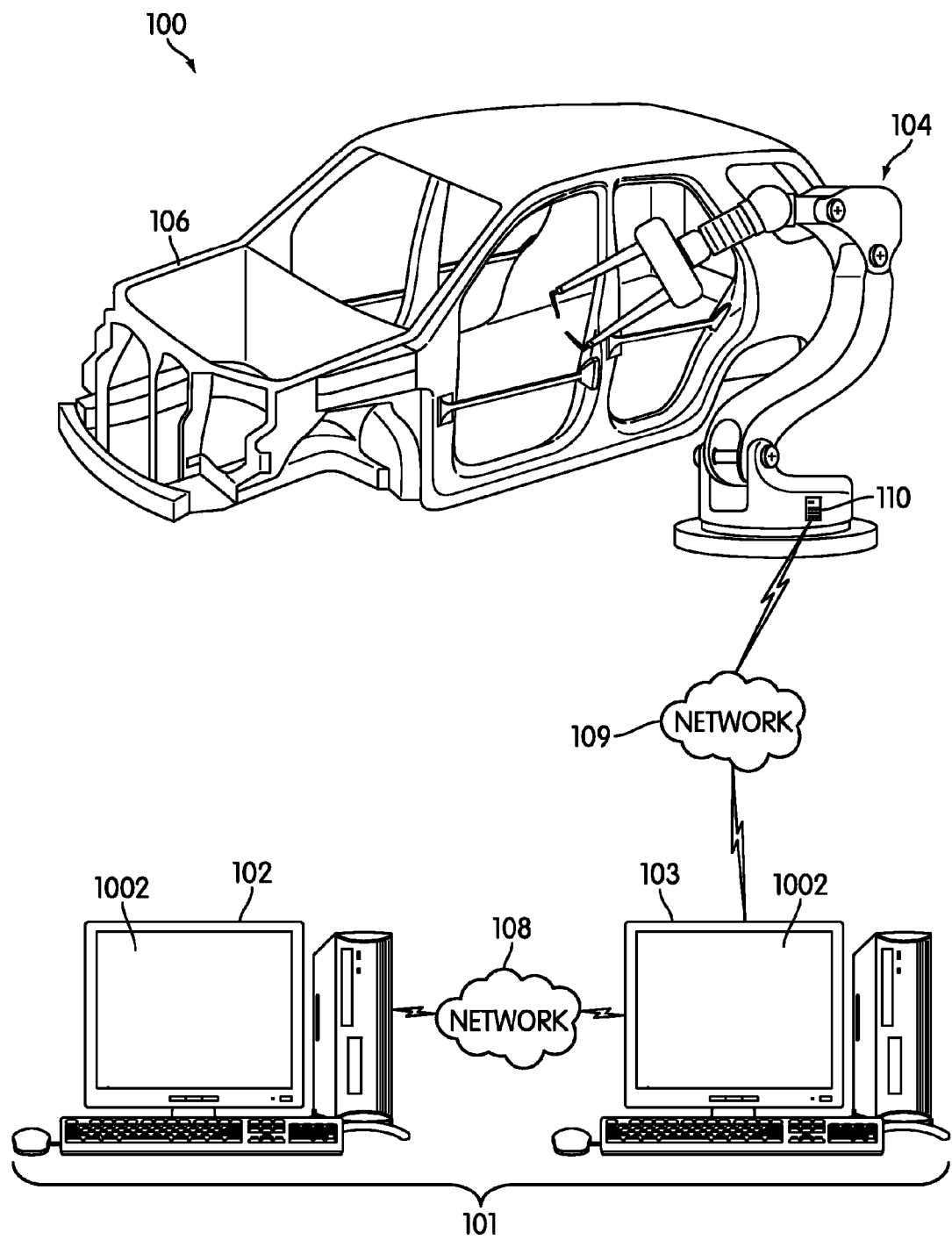
FIG. 1 is a schematic view of an embodiment of an automated assembly system.

FIG. 1 is a schematic view of an embodiment of automated assembly system 100 for a motor vehicle. Automated assembly system 100 can include network of computers 101. The term "network of computers" refers to any collection of one or more computers that may be used throughout the design and/or assembly phase of a motor vehicle. Generally, the term "computer" can refer to any device capable of manipulating data according to a list of instructions. In some embodiments, a computer can be a device that includes a display and a processor. In some cases, a computer can be a desktop computer. In other cases, a computer can be a laptop computer. In still other cases, a computer could be a personal digital assistant or any other portable computing device.

In an exemplary embodiment, network of computers 101 can include first computer 102 and second computer 103. In some cases, first computer 102 may be utilized in the design of a motor vehicle. Likewise, second computer 103 may be utilized in controlling one or more machines used in the assembly of a motor vehicle. In other cases, however, first computer 102 may be utilized for controlling one or more machines and second computer 103 can be utilized for designing a motor vehicle. In still other cases, first computer 102 and second computer 103 can both be used for design and controlling machines for assembly.

It will be understood that while the current embodiment illustrates two computers, in other embodiments network of computers 101 can include additional computers. For example, in other embodiments network of computers 101 can include two or more computers for designing a motor vehicle. Likewise, in other embodiments, network of computers 101 can include two or more computers for controlling one or more machines for assembling a motor vehicle. In still another embodiment, a single computer can be used for designing a motor vehicle and controlling one or more machines for assembling a motor vehicle.

A network of computers can further include systems utilized in communications between one or more computers. For example, network of computers 101 can be associated with first network 108 for providing communication between first computer 102 and second computer 103. Generally, first network 108 may be a system allowing for the exchange of information between one or more computers. Examples of such networks include, but are not limited to: personal area networks, local area networks, wide area networks, client-server networks, peer-to-peer networks, as well as other types of networks. Additionally, the network may support wired transmissions, wireless transmissions, or both wired and wireless transmissions. In some embodiments, first network 108 may be a packet-switched communications system. In one embodiment, first network 108 may be the Internet.

Automated assembly system 100 can also include robot 104. Generally, robot 104 can be any device configured to apply fasteners, including welds, to components of an assembly. Generally, robot 104 can be used for any type of welding. In some embodiments, robot 104 can be used for arc welding. In some cases, robot 104 can be used for gas metal arc welding. In other cases, robot 104 can be used for resistance spot welding.

In an exemplary embodiment, robot 104 may be a welding robot that is capable of welding components of a motor vehicle together. For example, in an exemplary embodiment, robot 104 can be configured to apply welds to vehicle portion 106. In this embodiment, vehicle portion 106 is associated with the body-in-white stage of motor vehicle production. In other words, vehicle portion 106 may comprise a vehicle frame, doors, hoods, deck lids as well as other components.

In different embodiments, robot 104 can be controlled in various ways. In some cases, robot 104 can include control unit 110 for receiving information used for performing assembly. Control unit 110 can include a user interface allowing a user to manually control robot 104. Control unit 110 can also include provisions for receiving information from one or more computers. In an exemplary embodiment, control unit 110 may be in communication with second computer 103. In particular, control unit 110 may be in communication with second computer 103 using second network 109. It will be understood that second network 109 may be any type of network including those discussed above.

Generally, robot 104 can be controlled using any known method for controlling robots. Examples of robot control systems include, but are not limited to: selective component assembly robot arm systems (SCARA) and Cartesian coordinate robot systems.

In some embodiments, robot 104 and vehicle portion 106 can be located within a manufacturing facility. The term "manufacturing facility" as used throughout this detailed description and in the claims, refers to any location that is associated with the physical manufacturing of one or more components of a motor vehicle. In some cases, a manufacturing facility can comprise a factory. In other cases, a manufacturing facility can be any building or collection of buildings configured to house robot 104.

Figure 2:
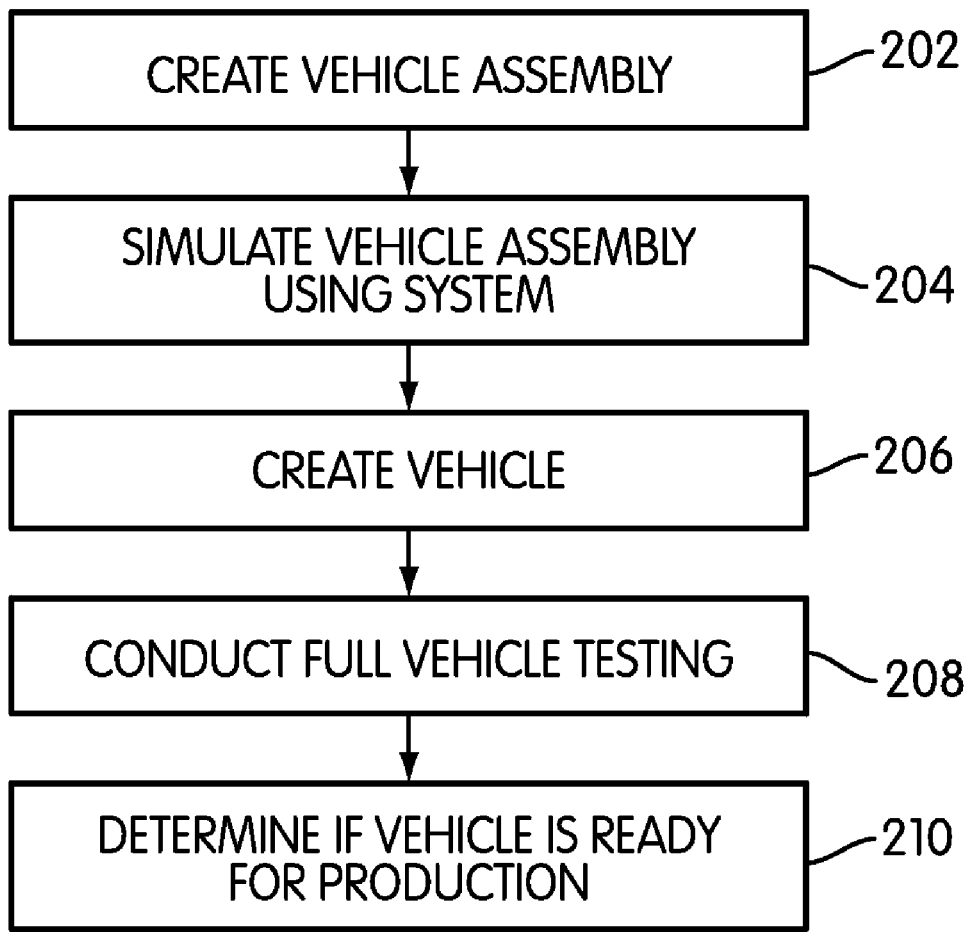
FIG. 2 is an embodiment of a process for an automated assembly system.

FIG. 2 illustrates an exemplary embodiment of a process for an automated assembly system. During step 202, a vehicle assembly can be created using a computer design system. The term "vehicle assembly" as used throughout this detailed description and in the claims, refers to a virtual representation of a motor vehicle that is created, displayed and/or manipulated within a computer design system. Generally, any type of computer design system can be used. In an exemplary embodiment, a computer aided design (CAD) system can be used. Examples of various CAD systems are well known in the art, including, but not limited to: 2D vector-based systems, 3D solid and surface modeling systems, as well as other types of CAD systems that are known in the art.

During step 204, a vehicle assembly can be simulated to determine the viability of a vehicle design. For example, vehicle collisions can be simulated to determine if a vehicle assembly meets basic safety standards. Additionally, typical driving conditions can be simulated to determine if the vehicle design provides the desired operability for a motor vehicle. Generally, any type of simulation system can be used for simulating a vehicle assembly. In some embodiments, a CAD system used for creating a vehicle assembly can include provisions for simulating the vehicle assembly. In other embodiments, a vehicle assembly created using a CAD system can be transferred to a computer aided engineering system (CAE) system for purposes of simulating the vehicle assembly. In one exemplary embodiment, the simulation system can be a finite element analysis system. In particular, a wire mesh comprising a collection of finite elements can be generated according to vehicle assembly data created within a CAD system.

Once a vehicle assembly has been simulated, a physical vehicle can be fabricated based on the vehicle assembly during step 206. In particular, the vehicle assembly includes information that can be used to construct a body-in-white stage for a motor vehicle. In some embodiments, the manufacturing of a physical vehicle can be accomplished using a computer aided manufacturing system (CAM).

Following step 206, full vehicle testing can be accomplished during step 208. In some embodiments, full vehicle testing can include performing safety tests. In addition, other tests can be performed to determine if the motor vehicle operates correctly as well as to determine other factors such as driver and passenger comfort. Following vehicle testing, which occurs during step 208, a manufacturer can determine if a vehicle is ready for production during step 210. In particular, the manufacturer can evaluate the results of full vehicle testing to determine if the vehicle meets the desired safety requirements and/or other operational requirements.

An automated assembly system can include provisions for automatically creating and utilizing weld information associated with a motor vehicle design. In particular, an automated assembly system can include provisions to help a designer easily determine one or more assembly parts of a vehicle assembly that should be connected by various welds. Furthermore, an automated assembly system can include provisions to facilitate quick and efficient manufacturing of a motor vehicle using vehicle assembly information including knowledge of weld data and connected parts.

Figure 3:
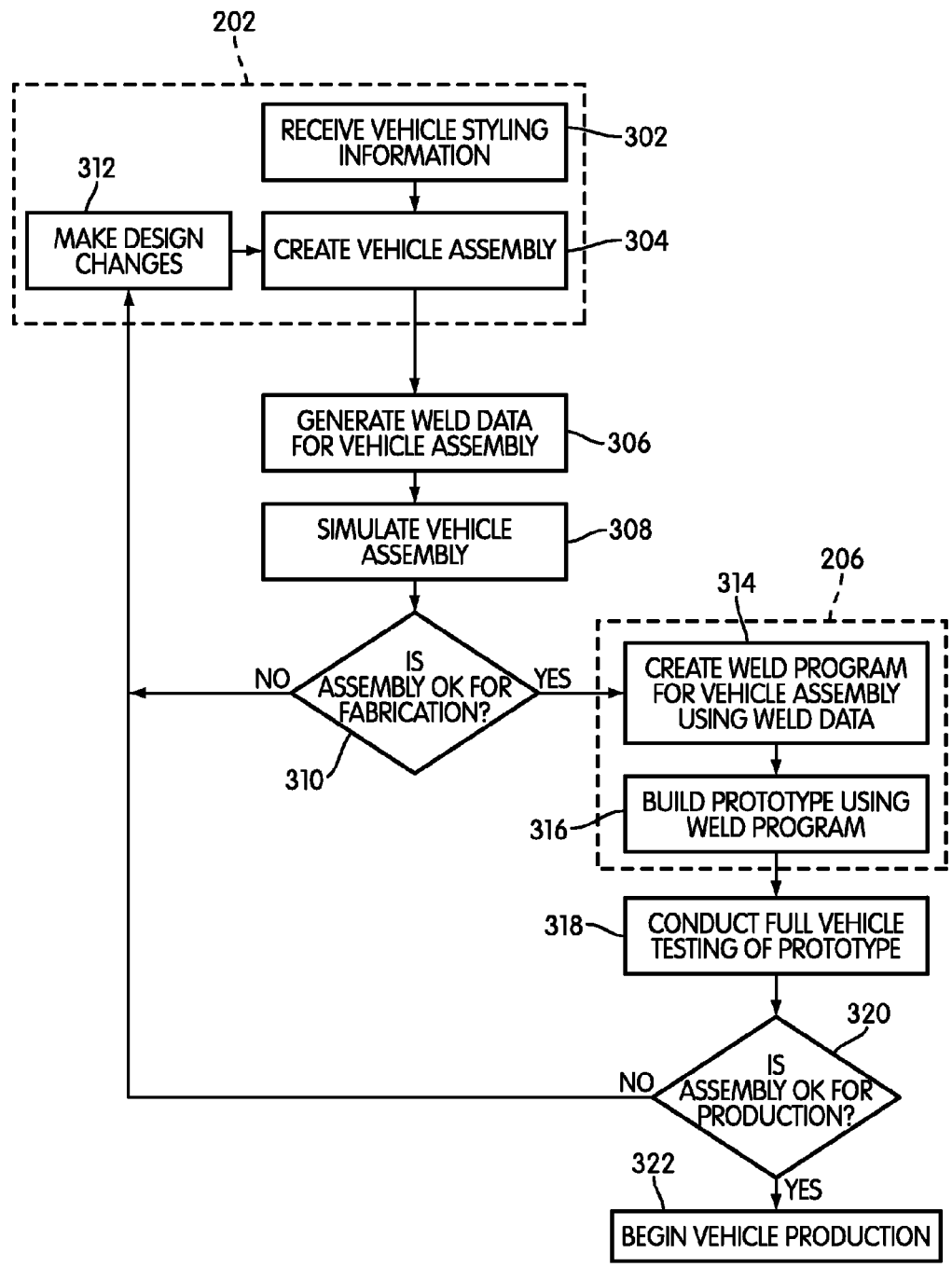
FIG. 3 is an embodiment of a detailed process for an automated assembly system.

FIG. 3 illustrates an embodiment of a detailed process for an automated assembly system. During a first step 302, a designer can receive vehicle styling information. Generally, vehicle styling information can be received in any format. Examples of formats include, but are not limited to: drawings, a physical model, and/or a computer generated design.

Next, during step 304, a designer can create a vehicle assembly. In particular, a designer can generate a virtual model that corresponds to the vehicle styling information received during step 302. At this stage, a vehicle assembly may comprise a plurality of individual assembly parts that are combined into a single model.

After step 304, during step 306, a vehicle assembly can be associated with weld data that is associated with the vehicle assembly. The term "weld characteristics" refers to any information associated with weld location, weld type, weld geometry, weld material as well as any other characteristics of one or more welds. In some cases, one or more weld characteristics can be manually defined by a designer. In other cases, one or more weld characteristics can be automatically generated by a computer design system. In an exemplary embodiment, a designer can select a weld type and a weld location and have the weld geometry and materials automatically generated by the computer design system.

Once a vehicle assembly including weld characteristics has been created, the vehicle assembly may be simulated during step 308. As previously discussed, the vehicle assembly may be converted to a collection of finite elements to be used in a simulation system. Furthermore, each weld associated with the vehicle assembly can be converted to a collection of finite elements. With this arrangement, the simulation system can more accurately simulate a motor vehicle by simulating the connection of individual parts through various welds and/or other fasteners.

Following step 308, the designer can assess the design during step 310. In particular, the designer can determine if the vehicle assembly meets the requirements for fabrication of a prototype vehicle. If, during step 310 a designer determines that the vehicle assembly is not ready for fabrication, the designer may proceed to step 312. During step 312, the designer may make changes to the vehicle design using the computer design system.

If, during step 310, the designer determines that the vehicle assembly is ready for fabrication, the vehicle assembly can be submitted for fabrication. At this point, the vehicle assembly can be used to automatically create a weld program during step 314. In particular, a weld program can be automatically generated using weld information associated with the vehicle assembly. Once a weld program has been created during step 314, the weld program can be used to build a prototype during step 316.

Following step 316, once a prototype has been created, full vehicle testing can be conducted on the prototype during step 318. Next, during step 320, the prototype can be assessed to determine if the vehicle is ready for full scale production. If the prototype is not ready for production, the process may proceed back to step 312, where a designer can continue to make changes to a vehicle design. Otherwise, a manufacturer can proceed to step 322 to begin vehicle production.

Figure 4:
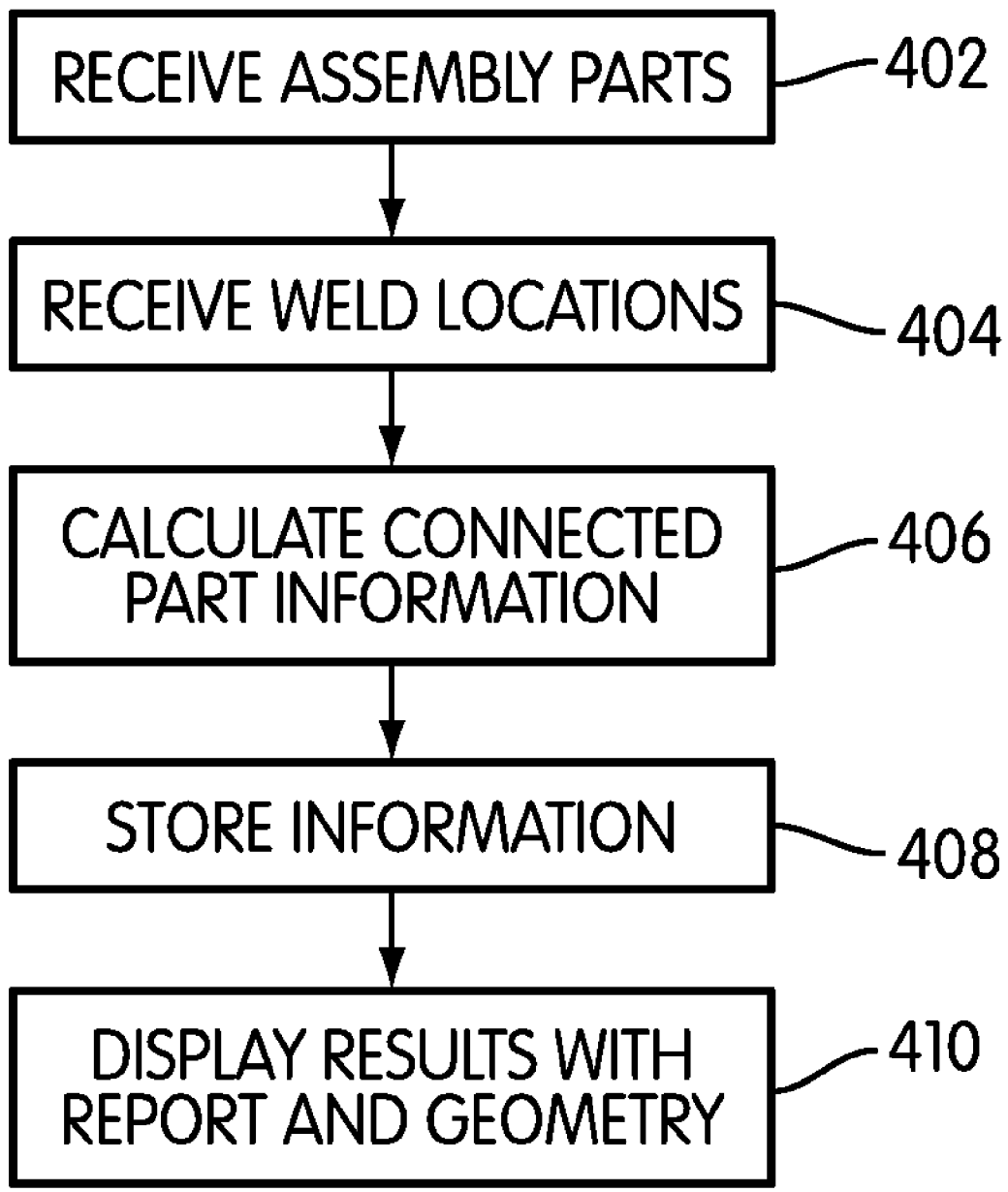
FIG. 4 is an embodiment of a process for an automated assembly system.

FIG. 4 is an embodiment of a process for automatically generating weld data using a computer design system. During step 402, the design system may receive assembly parts associated with a vehicle assembly. In some cases, the assembly parts may comprise a substantial entirety of a vehicle assembly. In other cases, the assembly parts may comprise only some parts of the vehicle assembly. For example, if a designer is interested in creating and/or associating weld characteristics with a particular portion of a vehicle assembly, the designer may only load a subset of the parts of the vehicle assembly.

Next, during step 404, a design system may receive the locations of one or more welds associated with the loaded assembly parts. In some cases, the design system can provide a user interface for a designer that allows the designer to identify one or more weld locations as well as other types of weld information. Following step 404, a design system may use the weld location information to calculate the connected part information for the loaded assembly parts during step 406. In other words, the design system can determine which assembly parts are joined by the welds associated with a particular weld location. In addition, during step 406, the design system can determine additional weld characteristics such as the weld geometry, according to the connected part information.

Following step 406, the design system can proceed to step 408. During step 408, the design system can store information related to the assembly parts and the weld information. In some cases, the design system can then proceed to step 410 in order to display information. In particular, during step 410, the design system can display results in a report form as well as a three dimensional representation of the assembly parts and the welds generated during the design process.

An automated assembly system can include provisions for automatically determining a set of connected assembly parts associated with one or more welds. The term "set of connected assembly parts" as used throughout this detailed description and in the claims refers to a set of assembly parts of a vehicle assembly that are joined by one or more welds. In some cases, the automated assembly system can be configured to receive weld location information from a user and automatically calculate the set of connected assembly parts according to the weld location information. Furthermore, the automated assembly system can be configured to automatically generate weld characteristics according to the weld location information and the set of connected parts.

Figure 5:
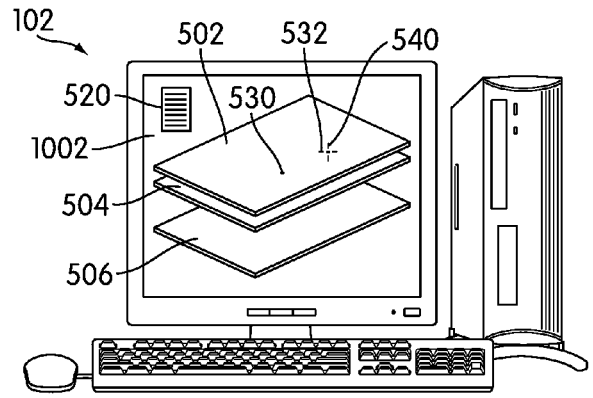
FIG. 5 is a schematic view of an embodiment of a computer design system for an automated assembly system.
Figure 6:
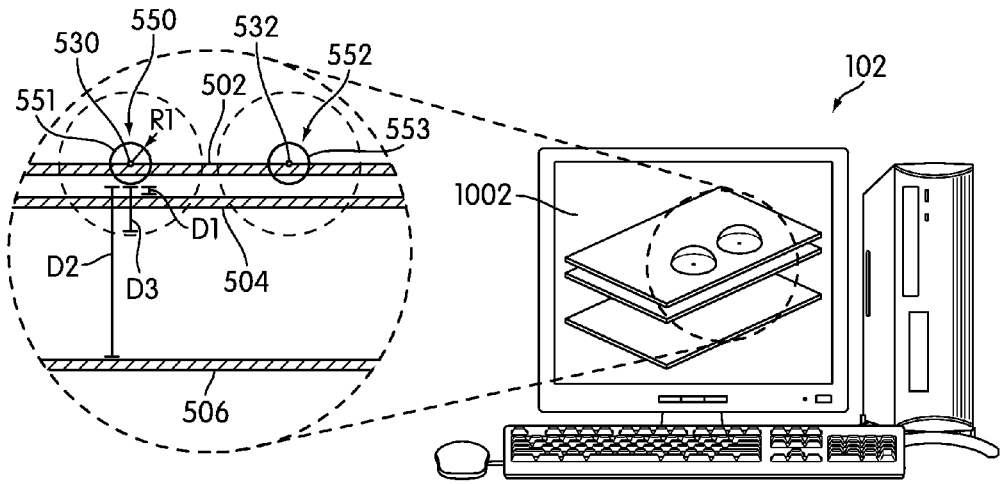
FIG. 6 is a schematic view of an embodiment of a computer design system for an automated assembly system.
Figure 7:
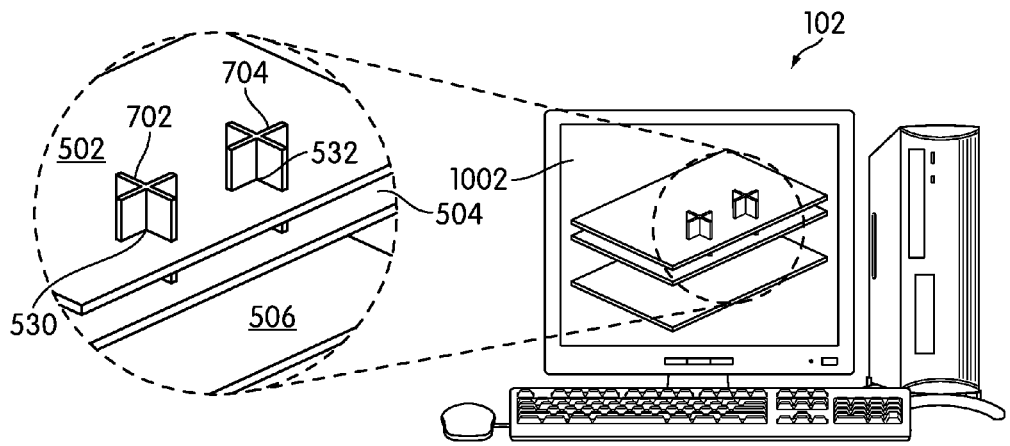
FIG. 7 is a schematic view of an embodiment of a computer design system for an automated assembly system.

FIGS. 5 through 7 illustrate an embodiment of a process for calculating connected part information. In the exemplary embodiment, the process of calculating connected part information is performed using first computer 102 of network of computers 101. However, it will be understood that in other embodiments this process could be performed using any computer from network of computers 101. In addition, Figures are intended to schematically illustrate the process of determining connected part information. In some cases, the steps illustrated in FIGS. 5 through 7 may not be visually displayed by a computer design system, but may be performed internally without any output to a display.

Referring to FIG. 5, the design system can load one or more assembly parts that may be selected by a designer. In this exemplary embodiment, first part 502, second part 504 and third part 506 are loaded and displayed. For purposes of clarity, first part 502, second part 504 and third part 506 are illustrated as three rectangular pieces of sheet metal. In other embodiments, however, first part 502, second part 504 and third part 506 could have any shape. In addition, in other embodiments any other number of parts can be loaded.

Once first part 502 and second part 504 are loaded, a user may specify weld locations. In some embodiments, a design system can include weld menu 520 for inputting weld location information. In some cases, a user can input weld type and weld location. In this exemplary embodiment, a user has selected first weld location 530 and second weld location 532 using weld menu 520 and cursor 540.

Once a user has selected locations and types for one or more welds, a design system can be configured to automatically determine a set of connected parts that should be connected using the welds indicated at one or more weld locations. Referring to FIG. 6, a design system may first generate first sphere 550 around first weld location 530. In different embodiments, the sizes of spheres generated around one or more weld locations can vary. In this embodiment, first sphere 550 is associated with radius R1. In some cases, the value of R1 can vary in the range between 0.1 and 1 mm. In other embodiments, the value of R1 can vary in the range between 0.3 and 0.7 mm. In an exemplary embodiment the value of R1 could be approximately 0.5 mm. In still other embodiments, the value of R1 can be greater than 1 mm. In still other embodiments, the value of R1 can be less than 0.1 mm.

Once first sphere 550 is generated, a design system can determine the distance between first sphere 550 to all loaded assembly parts. In the current embodiment, first surface 551 is disposed first distance D1 from second part 504. Likewise, first surface 551 is disposed a distance D2 from third part 506.

At this point, the design system may determine if the loaded parts are within a predefined distance to first surface 551 of first sphere 550. In this embodiment, second part 504 lies within predefined distance D3 of first surface 551. However, third part 506 does not lie within predefined distance D3 of first surface 551. Therefore, the design system determines that second part 504 is connected to first part 502 using a weld located at first weld location 530, while third part 506 is not connected to first part 502.

Generally, the value of D3 can vary. In some cases, the value of D3 can vary in the range between 0.5 and 30 mm. In other cases, the value of D3 can vary in the range between 5 and 15 mm. In an exemplary embodiment, D3 can have a value of approximately 8 mm. In other words, any parts located within approximately 8 mm of first surface 551 of first sphere 550 may be determined to be connected to first part 502 using a weld located at first weld location 530. In still other embodiments, the value of D3 can be less than 0.5 mm. In still other embodiments, the value of D3 can be greater than 30 mm.

In a similar manner, the design system may apply second sphere 552 around second weld location 532 to determine which parts are disposed within a predetermined distance of second surface 553 of second sphere 552. With this arrangement, the design system can determine which parts are connected to first part 502 using a weld located at second weld location 532.

Once the design system has determined which parts are connected by one or more welds, the design system may proceed to automatically determine one or more characteristics of the welds. Referring to FIG. 7, the design system can use the weld locations as well as the connected parts information to automatically generate the weld geometries. In this example, first weld 702 and second weld 704 are generated around first weld location 530 and second weld location 532, respectively. In particular, first weld 702 and second weld 704 both have approximately cross-like shapes. In other case, the welds could have any other cross-sectional shape including, but not limited to, rounded shapes, rectangular shapes, triangular shapes, polygonal shapes, regular shapes, irregular shapes as well as any other shapes. In addition to automatically determining the shapes of first weld 702 and second weld 704, the design system may be configured to automatically generate additional weld characteristics including weld thickness and in some cases, weld material. In other cases, however, a user can select the weld material manually.

Figure 8:
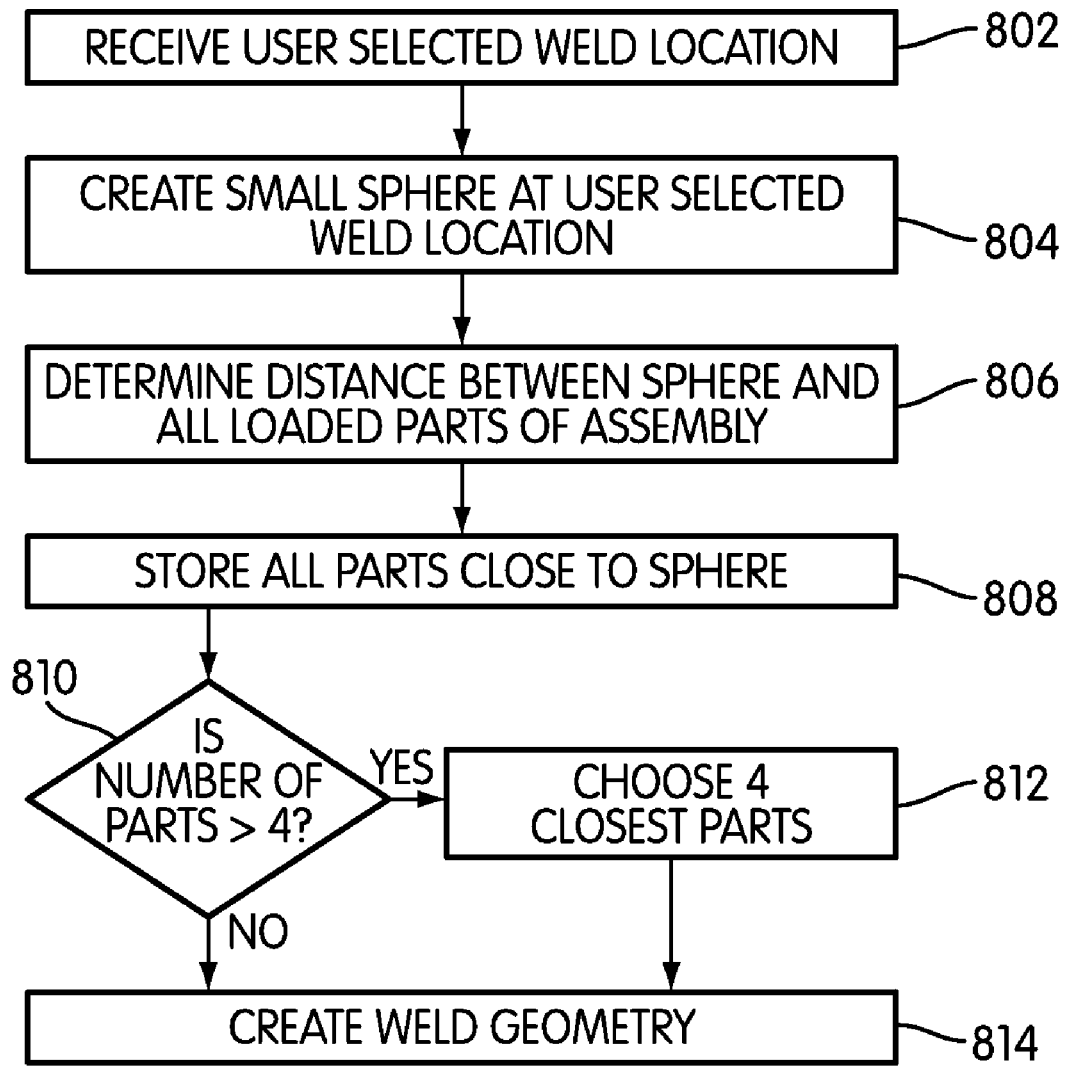
FIG. 8 is an embodiment of a process for determining connected part information for a vehicle assembly.

FIG. 8 is an embodiment of a process for automatically determining connected parts of a vehicle assembly using weld location information. Beginning at step 802, the design system may receive a user selected weld location. Next, during step 804, the design system may create a small sphere at the user selected weld location. As previously discussed, the size of the sphere can vary in different embodiments. Next, during step 806, the design system can determine the distance between the sphere and all loaded assembly parts.

Following step 806, during step 808, the design system can store all the assembly parts close to the sphere. In other words, the design system can store all the assembly parts that are located within a predetermined distance of the surface of the sphere. At this point, the design system can proceed to step 810, to determine if the number of parts is greater than four. If the number of parts is greater than four, the system selects the four closest parts to the surface of the sphere during step 812. Following step 812, the design system proceeds to step 814. By limiting the number of connected parts to 4, an automated assembly system may help prevent weakened fastening points in a vehicle that could occur if a single weld is used for fastening too many parts.

Although the current embodiment uses a predetermined maximum of four connected parts, in other embodiments any other number could be used for the predetermined maximum. In another embodiment, a weld could be associated with a maximum of two connected parts. In still another embodiment, a weld could be associated with a maximum of three connected parts. In still another embodiment, a weld could be associated with a maximum of five or more connected parts.

If, during step 810 the design system determines that there are not more than four connected parts, the system also proceeds to step 814. During step 814, the system automatically generates the weld geometry, including, in some cases, the weld shape, size and material.

Figure 9:
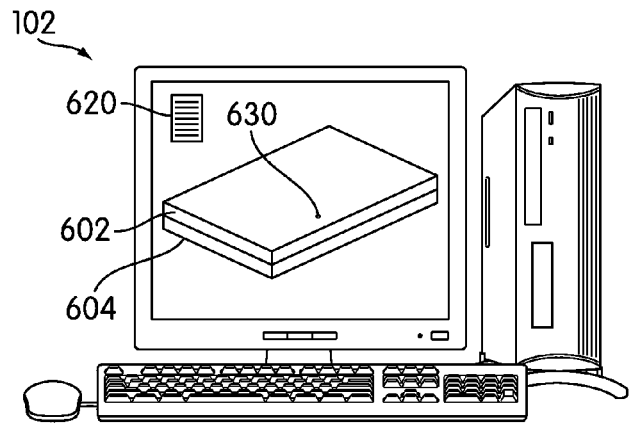
FIG. 9 is a schematic view of an embodiment of a computer design system for an automated assembly system.
Figure 10:
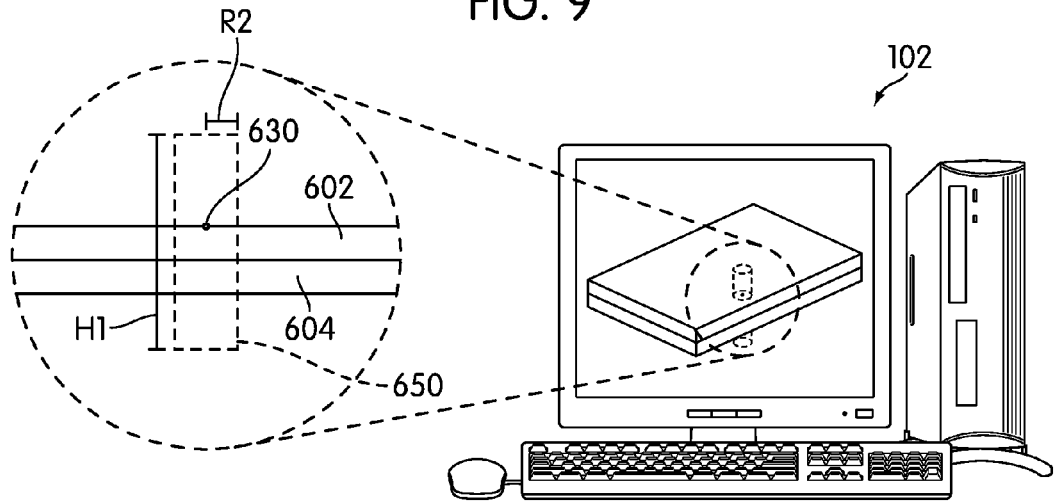
FIG. 10 is a schematic view of an embodiment of a computer design system for an automated assembly system.
Figure 11:
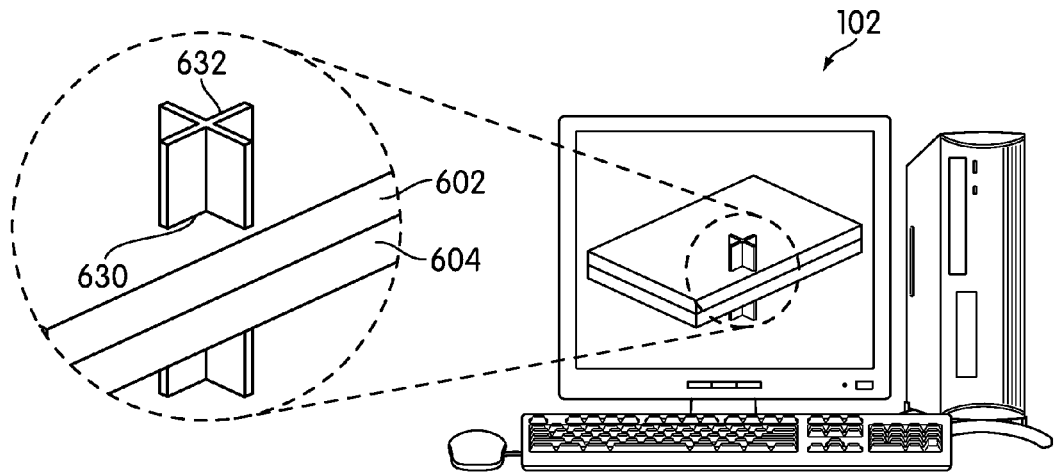
FIG. 11 is a schematic view of an embodiment of a computer design system for an automated assembly system.

FIGS. 9 through 11 illustrate an embodiment of another process for calculating connected part information. In the exemplary embodiment, the process of calculating connected part information is performed using first computer 102 of network of computers 101. However, it will be understood that in other embodiments this process could be performed using any computer from network of computers 101. In addition, Figures are intended to schematically illustrate the process of determining connected part information. In some cases, the steps illustrated in FIGS. 9 through 11 may not be visually displayed by a computer design system, but may be performed internally without any output to a display.

Referring to FIG. 9, the design system can load one or more assembly parts that may be selected by a designer. In this exemplary embodiment, first part 602 and second part 604 are loaded and displayed. For purposes of clarity, first part 602 and second part 604 are illustrated as two rectangular pieces of sheet metal. In other embodiments, however, first part 602 and second part 604 could have any other shape. In addition, in other embodiments any other number of parts can be loaded.

Once first part 602 and second part 604 are loaded, a user may specify weld locations. In some embodiments, a design system can include weld menu 620 for inputting weld location information. In some cases, a user can input weld type and weld location. In this exemplary embodiment, a user has selected weld location 630 using weld menu 620.

Once a user has selected locations and types for one or more welds, a design system can be configured to automatically determine a set of connected parts that should be connected using the welds indicated at one or more weld locations. Referring to FIG. 10, a design system may first generate cylinder 650 around weld location 630. In some cases, a design system may orient cylinder 650 in a perpendicular manner with respect to first part 602 and/or second part 604. In other cases, a design system could orient cylinder 650 in any other manner. In different embodiments, the sizes of cylinder generated around one or more weld locations can vary. In this embodiment, cylinder 550 is associated with radius R2 and height H1. In some cases, the value of R2 can vary in the range between 0.1 and 4 mm. In other embodiments, the value of R2 can vary in the range between 1.5 and 2.5 mm. In an exemplary embodiment the value of R2 could be approximately 2.0 mm. In still other embodiments the value of R2 could be less than 0.1 mm. In still other embodiments, the value of R2 could be greater than 4 mm. In some cases, the value of H1 can vary in the range between 0.1 and 20 mm. In other embodiments, the value of H1 can vary in the range between 5 and 15 mm. In an exemplary embodiment, the value of H1 may be approximately 10 mm. In still other embodiments, the value of H1 may be less than 0.1 mm. In still other embodiments, the value of H1 may be greater than 20 mm.

Once cylinder 650 is generated, a design system can determine the set of parts that interfere, or intersect with, cylinder 650. In the current embodiment, cylinder 650 intersects first part 602 and second part 604. Therefore, the design system determines that second part 604 is connected to first part 602 using a weld located at weld location 630.

Once the design system has determined which parts are connected by one or more welds, the design system may proceed to automatically determine one or more characteristics of the welds. Referring to FIG. 11, the design system can use the weld location as well as the connected parts information to automatically generate the weld geometry. In this example, weld 632 is generated around weld location 630. In some cases, weld 632 may have an approximately cross-like shape. In other case, weld 632 could have any other cross-sectional shape including, but not limited to, rounded shapes, rectangular shapes, triangular shapes, polygonal shapes, regular shapes, irregular shapes as well as any other shapes. In addition to automatically determining the shape of weld 632, the design system may be configured to automatically generate additional weld characteristics including weld thickness and in some cases, weld material. In other cases, however, a user can select the weld material manually.

Figure 12:
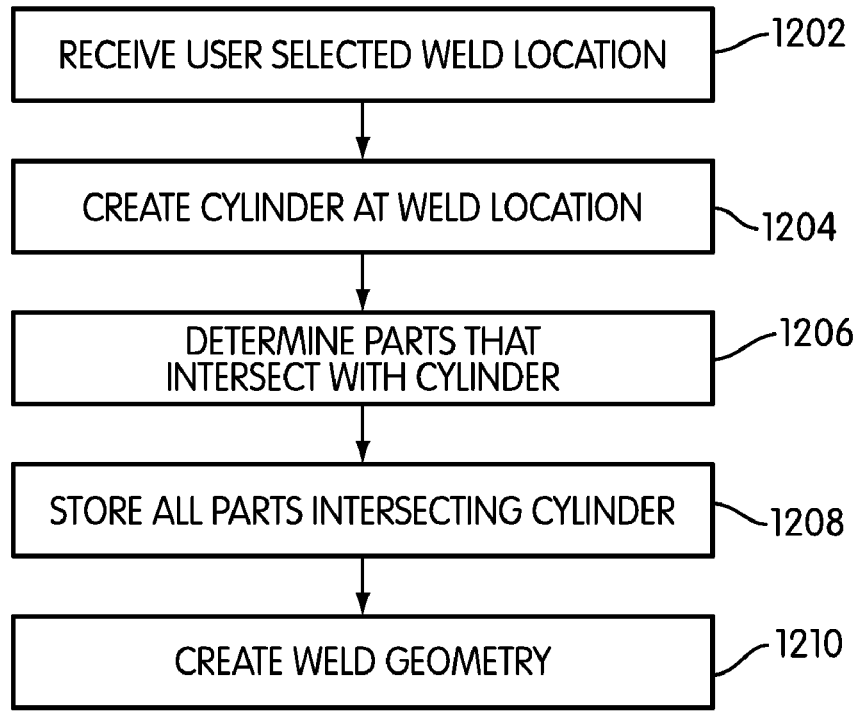
FIG. 12 is an embodiment of a process for determining connected part information for a vehicle assembly.

FIG. 12 is an embodiment of a process for automatically determining connected parts of a vehicle assembly using weld location information. Beginning at step 1202, the design system may receive a user selected weld location. Next, during step 1204, the design system may create a cylinder extending from the user received weld location. Following step 1204, during step 1206, the design system may determine all the parts that intersect the cylinder. Following this, during step 1206, the design system may store all the parts that intersect with the cylinder. Finally, during step 1208, the system automatically generates the weld geometry, including, in some cases, the weld shape, size and material.

An automated assembly system can include provisions for generating a weld program for a motor vehicle. In some embodiments, a weld program can be automatically created using information related to a vehicle assembly. In particular, welding information created within a computer design system can be used to automatically create a weld program.

Figure 13:
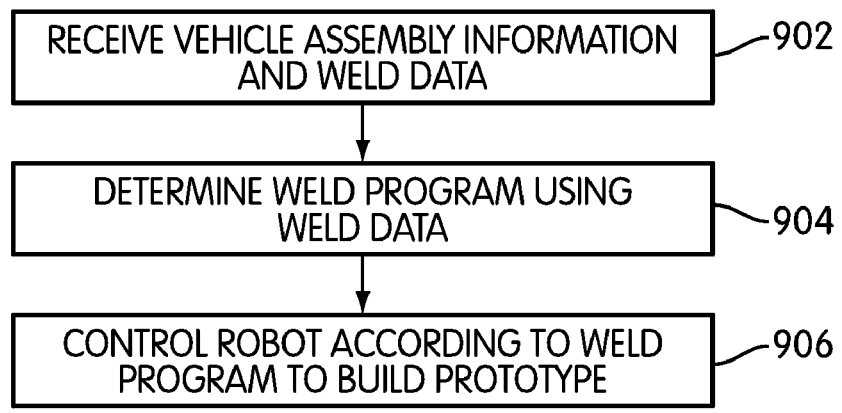
FIG. 13 is an embodiment of a process for an automated assembly system.

FIG. 13 is an embodiment of a process for producing a motor vehicle using automatically generated weld information. During a first step 902, a design system can receive information related to a vehicle assembly. This information can include the assembly parts, including connected part information. In addition, the design system can receive weld data. The weld data can include weld location and geometry as well as other weld characteristics. Next, during a second step 904, the design system can determine a weld program using the vehicle assembly information including weld data. In particular, the design system can determine weld locations for a weld program, as well as determine which parts must be connected at each weld location. Finally, during a third step 906, the design system can use the automatically generated weld program to control a robot for building a prototype vehicle.

Figure 14:
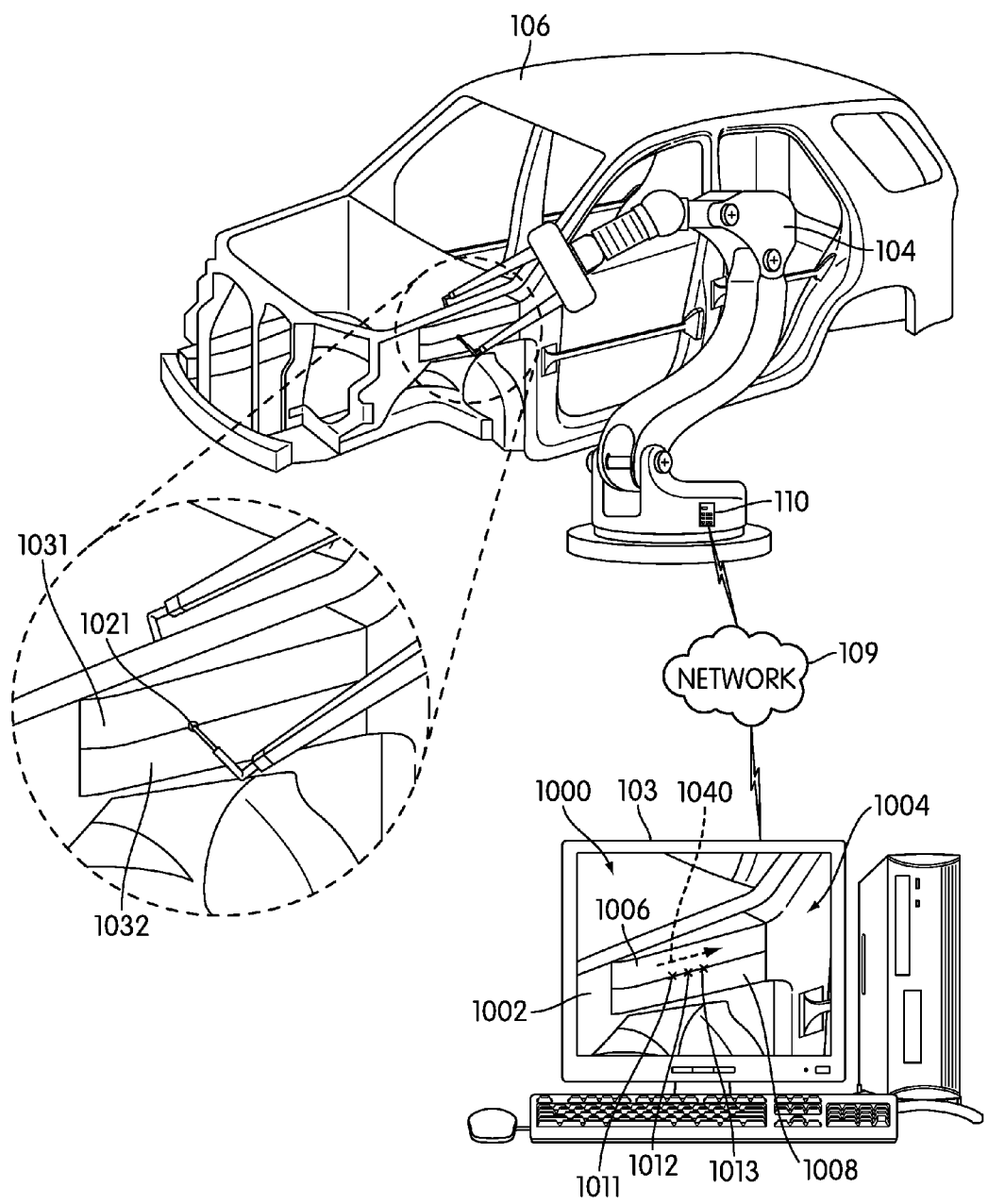
FIG. 14 is a schematic view of an embodiment of a step of welding a portion of a vehicle using a robot.
Figure 15:
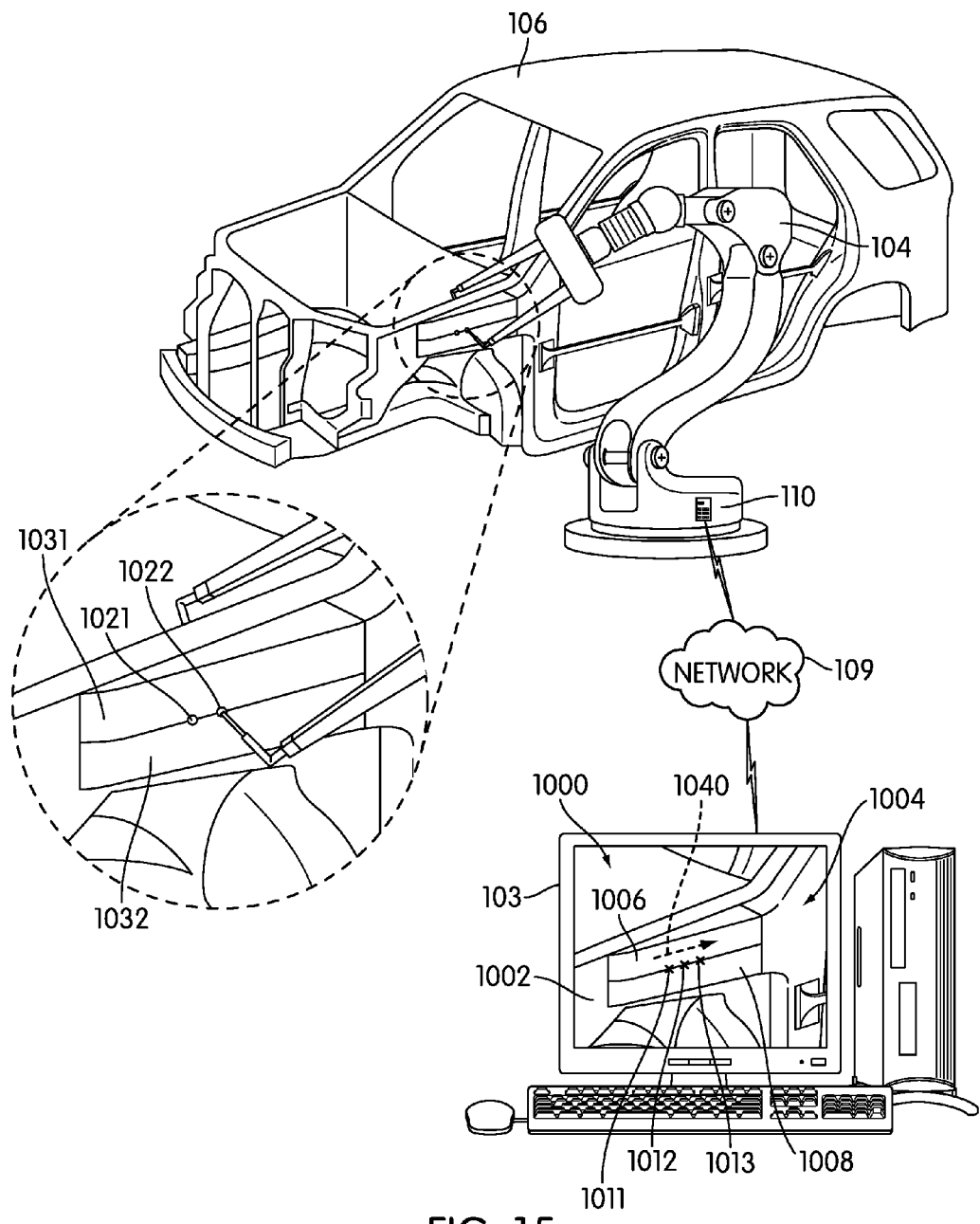
FIG. 15 is a schematic view of an embodiment of a step of welding a portion of a vehicle using a robot.
Figure 16:
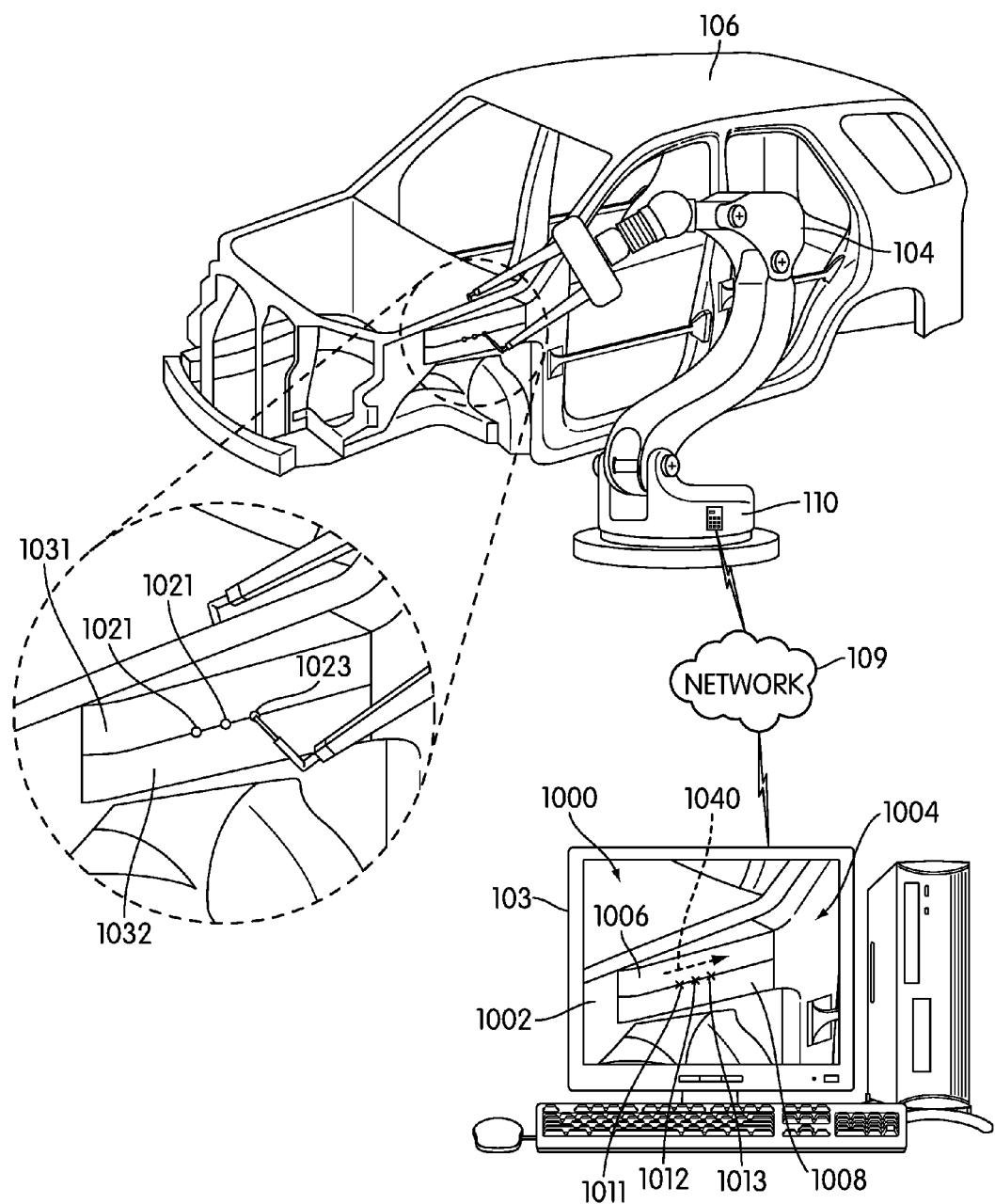
FIG. 16 is a schematic view of an embodiment of a step of welding a portion of a vehicle using a robot.

FIGS. 14 through 16 illustrate an embodiment of a process for applying welds to a body-in-white stage of a motor vehicle using an automatically generated weld program. In the current embodiment second computer 103 is in communication with robot 104 via first network 108. In particular, second computer 103 is configured to control robot 104 to apply welds to vehicle portion 106.

A visual representation of weld program 1000 is shown on display 1002 of second computer 103. In this example, vehicle assembly 1004 includes first assembly part 1006 and second assembly part 1008 that represent first vehicle panel 1031 and second vehicle panel 1032, respectively, of vehicle portion 106. In this embodiment, first assembly part 1006 and second assembly part 1008 are associated with welding information located at first weld location 1011, second weld location 1012 and third weld location 1013. In other words, first assembly part 1006 and second assembly part 1008 are connected assembly parts with respect to welds located at first weld location 1011, second weld location 1012 and third weld location 1013. Using weld program 1000, robot 104 may proceed to apply welds to first vehicle panel 1031 and second vehicle panel 1032 to fasten first vehicle panel 1031 and second vehicle panel 1032 together.

As discussed above, weld program 1000 may be automatically generated using assembly part information and weld information, such as weld location and weld characteristics. In some embodiments, weld program 1000 may include one or more weld paths for robot 104. The term "weld path" as used throughout this detailed description and in the claims refers to any predetermined path for robot 104 that is utilized for applying one or more welds to a vehicle.

Referring to FIGS. 14 through 16, robot 104 may apply welds to first vehicle panel 1031 and second vehicle panel 1032 along weld path 1040. In particular, robot 104 may apply first weld 1021 to first vehicle panel 1031 and second vehicle panel 1032 according to weld information associated with first weld location 1011. Next, robot 104 may apply second weld 1022 to first vehicle panel 1031 and second vehicle panel 1032 according to weld information associated with second weld location 1012. Finally, robot 104 may apply third weld 1023 to first vehicle panel 1031 and second vehicle panel 1032 according to weld information associated with third weld location 1013. With this arrangement, first vehicle panel 1031 and second vehicle panel 1032 may be fixedly joined.

In some cases, for example, weld program 1000 may include instructions for the type of weld to be created at each weld location. In other cases, weld program 1000 may include instructions for the geometry of the weld to be created at each weld location. In still other cases, weld program 1000 may include instructions for the size of the weld to be created at each weld location. In an exemplary embodiment, each weld location of weld program 1000 may be further associated with information related to weld type, weld shape and weld size. With this arrangement, robot 104 can be configured to create the desired types, sizes and shapes for first weld 1021, second weld 1022 and third weld 1023.

Although the exemplary embodiments discussed above include an automated assembly method for efficiently creating and utilizing welds for a motor vehicle, other embodiments of an automated assembly system can incorporate the use of other types of fasteners. Examples of other types of fasteners include, but are not limited to: bolts, screws, buckles, clamps, clips, flanges, nails, pegs, pins, retaining rings, rivets as well as many other types of fasteners. In other words, the automated assembly system discussed in this detailed description is not intended to be restricted to the design and application of weld type fastenings between various components of a vehicle.

While various embodiments of the invention have been described, the description is intended to be exemplary, rather than limiting and it will be apparent to those of ordinary skill in the art that many more embodiments and implementations are possible that are within the scope of the invention. Accordingly, the invention is not to be restricted except in light of the attached claims and their equivalents. Also, various modifications and changes may be made within the scope of the attached claims.

We claim:

1. A method of making a motor vehicle, comprising the steps of:
   receiving a vehicle assembly within a network of computers;
   receiving weld location information associated with the vehicle assembly;
   receiving a weld location for a first assembly part of the vehicle assembly and determining a second assembly part of the vehicle assembly to be connected to the first assembly part according to the weld location;
   determining a spherical surface about the weld location and determining a set of connected assembly parts that are disposed within a predetermined distance of the spherical surface;
   generating a set of weld characteristics based on the weld location information using at least one computer of the network of computers; and
   determining an automated weld program according to the weld location information and set of weld characteristics using at least one computer of the network of computers.

2. The method according to claim 1, wherein a welding robot is controlled according to the automated weld program.

3. The method according to claim 1, wherein the weld location information is the location of a weld on a surface of an assembly part of the vehicle assembly.

4. The method according to claim 1, wherein the step of generating the set of weld characteristics based on the weld location information includes determining a weld geometry.

5. The method according to claim 4, wherein the set of weld characteristics further include a weld thickness.

6. The method according to claim 1, wherein the predetermined distance varies in a range between 0.1 mm and 1 mm.

7. The method according to claim 1, wherein the step of determining the second assembly part to be connected to the first assembly part is followed by a step of storing the first assembly part and the second assembly part as a set of connected assembly parts.

8. A method of making a motor vehicle, comprising the steps of:
   receiving a vehicle assembly including a plurality of assembly parts;
   receiving a weld location for a first assembly part of the plurality of assembly parts;
   determining a second assembly part to be connected to the first assembly part according to the weld location information;
   determining a spherical surface about the weld location, the spherical surface being associated with a predefined size; and
   calculating an automated weld program, the automated weld program including information related to welding the first assembly part to the second assembly part.

9. The method according to claim 8, wherein a welding robot is controlled according to the automated weld program.

10. The method according to claim 8, wherein the weld location is associated with a surface of the first assembly part.

11. The method according to claim 8, wherein the predefined size is associated with a radius in a range between 0.1 mm and 1 mm.

12. The method according to claim 8, wherein the step of determining the spherical surface about the weld location is followed by a step of determining all connected parts within a predetermined distance from the spherical surface.

13. The method according to claim 12, wherein the step of determining all connected parts within the predetermined distance from the spherical surface further includes a step of storing all parts close to the spherical surface.

14. The method according to claim 13, wherein the step of storing all parts close to the spherical surface is followed by a step of determining if the number of stored parts is greater than four.

15. The method according to claim 14, wherein the step of determining if the number of stored parts is greater than four is followed by the step of choosing the four closest parts when the number of stored parts is greater than four.

16. A method of making a motor vehicle, comprising the steps of:
   receiving a vehicle assembly including a plurality of assembly parts;
   receiving a weld location for a first assembly part of the plurality of assembly parts;

retrieving a predefined sphere size;

determining a spherical surface about the weld location, the spherical surface being associated with the predefined sphere size;

retrieving a predetermined distance;

determining a set of connected assembly parts, the set of connected assembly parts including all the assembly parts within the predetermined distance from the spherical surface; and calculating an automated weld program according to the weld location information and set of connected assembly parts.

17. The method according to claim 16, wherein a welding robot is controlled according to the automated weld program.

18. The method according to claim 16, wherein the predefined sphere size is the in range between 0.1 mm and 1 mm.

19. The method according to claim 18, wherein the predefined sphere size is in the range between 0.3 mm and 0.8 mm.

20. The method according to claim 19, wherein the predefined sphere size is approximately 0.5 mm.

21. The method according to claim 16, wherein the predetermined distance is in the range between 1 mm and 20 mm.

22. The method according to claim 21, wherein the predetermined distance is in the range between 5 mm and 15 mm.

23. The method according to claim 22, wherein the predetermined distance is approximately 8 mm.

24. A method of making a motor vehicle, comprising the steps of:

receiving a vehicle assembly including a plurality of assembly parts;

receiving a weld location for a first assembly part of the plurality of assembly parts;

creating a cylinder about the weld location;

determining a set of connected parts, the set of connected parts including all the assembly parts that intersect the cylinder; and calculating an automated weld program according to the weld location information and set of connected assembly parts.

25. The method according to claim 24, wherein a welding robot is controlled according to the automated weld program.

26. The method according to claim 24, wherein the cylinder has a radius in the range between 1 mm and 4 mm.

27. The method according to claim 26, wherein the cylinder has a radius of approximately 2 mm.

28. The method according to claim 27, wherein the cylinder has a height in the range between 5 mm and 15 mm.

29. The method according to claim 28, wherein the cylinder has a height of approximately 10 mm.

* * * * *